(12) United States Patent
Aipperspach et al.

(10) Patent No.: US 7,161,390 B2
(45) Date of Patent: Jan. 9, 2007

(54) DYNAMIC LATCHING LOGIC STRUCTURE WITH STATIC INTERFACES FOR IMPLEMENTING IMPROVED DATA SETUP TIME

(75) Inventors: Anthony Gus Aipperspach, Rochester, MN (US); Peter Thomas Freiburger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 10/926,897

(22) Filed: Aug. 26, 2004

(65) Prior Publication Data
US 2006/0044020 A1    Mar. 2, 2006

(51) Int. Cl.
*H03K 19/20* (2006.01)
*H03K 19/094* (2006.01)
*H03K 19/096* (2006.01)
*H03K 19/00* (2006.01)

(52) U.S. Cl. .......................... 326/121; 326/93; 326/98

(58) Field of Classification Search ................ 326/121, 326/93, 98
See application file for complete search history.

(56) References Cited

U.S. PATENT DOCUMENTS 6,744,282 B1 *  6/2004  Dhong et al. ................ 326/93

* cited by examiner

*Primary Examiner*—Rexford Barnie
*Assistant Examiner*—Jason Crawford
(74) *Attorney, Agent, or Firm*—Joan Pennington

(57) ABSTRACT

A latching dynamic logic includes a dynamic logic gate, a static logic input interface, and a set-reset output latch. The dynamic logic gate receives a clock signal, a data signal, and a select signal output of the static logic input interface. The dynamic logic gate includes a dynamic node and a pulldown network coupled to the dynamic node. The pulldown network selectively discharges the dynamic node following a clock signal transition dependent on the data signal and the select signal output of the static logic input interface being active. The set-reset output latch is coupled to the dynamic node of the dynamic logic gate for providing an output signal.

13 Claims, 2 Drawing Sheets

DYNAMIC LATCHING LOGIC STRUCTURE WITH STATIC INTERFACES FOR IMPLEMENTING IMPROVED DATA SETUP TIME

FIELD OF THE INVENTION

The present invention relates generally to the electronic circuits field, and more particularly, relates to a dynamic latching logic structure with static interfaces for implementing improved data setup time.

DESCRIPTION OF THE RELATED ART

Many complex digital logic circuits, including processors, employ a technique called pipelining to perform more operations per unit of time and to increase throughput. Pipelining involves dividing a process into sequential steps, and performing the steps sequentially in independent stages. For example, if a process can be performed via n sequential steps, a pipeline to perform the process may include n separate stages, each performing a different step of the process. Since all n stages can operate concurrently, the pipelined process can potentially operate at n times the rate of the non-pipelined process. When a number of operations to be performed is large, the sizeable delay between the time the first operation is started and the first operation is completed does not appreciably increase an average time required per operation.

Hardware pipelining involves partitioning a sequential process into stages, and adding storage elements, such as groups of latches or flip-flops, commonly called registers, between stages to hold intermediate results. When the number of operations to be performed is large and the cost of adding storage elements between stages is small compared to the cost of the stages themselves, pipelining is advantageous.

In general, two factors prevent a pipelined process from reaching the theoretical n-fold gain in operating rate. First, a maximum rate at which each step of the operation can be performed will be determined by the slowest stage in the process. Second, a certain amount of time is required to transfer the results of one stage to the next.

In a typical hardware pipeline, combinational logic within each stage performs logic functions upon input signals received from a previous stage. The storage elements positioned between the combinational logic of each stage are responsive to one or more synchronizing clock signals.

In general, common complementary metal oxide semiconductor (CMOS) logic structures, for example, gates, latches, registers, and the like, are either static or dynamic. Static logic structures generally include static nodes connected via one or more low resistance paths to one of two power supply voltage levels, for example, to either VDD or VSS, at all times during operation. The low resistance paths are typically formed through activated metal oxide semiconductor (MOS) devices, such as transistors.

Dynamic logic structures, on the other hand, generally include dynamic nodes having capacitances upon which electrical charges are stored. The dynamic nodes are typically charged to one voltage level or precharged during a precharge operation, and selectively charged, for example, discharged to another voltage level during a subsequent evaluation operation dependent upon one or more input signals. For example, dynamic nodes of dynamic logic circuits are commonly precharged to a high voltage level when a synchronizing clock signal is at one voltage level, such as a low voltage level, and selectively discharged to a low voltage level dependent upon the input signals when the clock signal transitions to another voltage level, such as, a high voltage level.

In general, static logic circuits are less sensitive to noise, clock signal timing, signal race conditions, and semiconductor process variations than dynamic logic structures. Dynamic logic structures, on the other hand, typically operate faster and require less integrated circuit die areas than similar static logic structures. Due to their drawbacks, dynamic logic circuits are often relegated to highly-specialized, hand-tuned circuits, typically those along critical timing paths.

Dynamic latching structures with static interfaces are known in the art. For example, U.S. Pat. No. 6,744,282, issued Jun. 1, 2004, and assigned to the present assignee, discloses a latching dynamic logic structure including a static logic interface, a dynamic logic gate, and a static latch. The static logic interface receives a data signal, a select signal, and a clock signal, and produces a first intermediate signal such that when the select signal is active, the first intermediate signal is dependent upon the data signal for a period of time following a clock signal transition. The dynamic logic gate discharges a dynamic node following the clock signal transition dependent upon the first intermediate signal. The static latch produces an output signal assuming one of two logic levels following the clock signal transition, and assuming the other logic level in the event the dynamic node is discharged. A scan-testing-enabled version of the latching dynamic logic structure and an integrated circuit including the latching dynamic logic structure are disclosed.

The subject matter of the above-identified U.S. Pat. No. 6,744,282 is incorporated herein by reference.

While the above-identified U.S. Pat. No. 6,744,282 provides improvements over prior art arrangements, it is desirable to provide a latching dynamic logic structure with an improved or shorter setup time. Shortening the setup time to latches directly impacts the frequency in which a macro or chip can run. The shorter the setup time the faster the chip can run.

SUMMARY OF THE INVENTION

A principal aspect of the present invention is to provide a latching dynamic logic structure with static interfaces for implementing improved data setup time. Other important aspects of the present invention are to provide such latching dynamic logic structure with static interfaces for implementing improved data setup time substantially without negative effect and that overcomes some of the disadvantages of prior art arrangements.

In brief, a latching dynamic logic structure with static interfaces is provided for implementing improved data setup time. The latching dynamic logic includes a dynamic logic gate, a static logic input interface, and a set-reset output latch. The dynamic logic gate receives a clock signal, a data signal, and a select signal output of the static logic input interface. The dynamic logic gate includes a dynamic node and a pulldown network coupled to the dynamic node. The pulldown network selectively discharges the dynamic node following a clock signal transition dependent on the data signal and the select signal output of the static logic input interface being active. The set-reset output latch is coupled to the dynamic node of the dynamic logic gate for providing an output signal.

In accordance with features of the invention, the pulldown network includes a pair of series connected transistors connected between the dynamic node and an evaluation transistor. One of the pair of series connected transistors receives a gate input of the data signal and the other of the pair of series connected transistors receives a gate input of the select signal output of the static logic input interface. The static logic input interface includes a select buffering chain including a pair of logic gates.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiment, a multiplexing function is implemented within a dynamic pull-down network instead of with a NOR gate ahead of the dynamic pull-down network as is done in the prior art latching dynamic logic structure of the above-identified U.S. Pat. No. 6,744,282. By doing so, a latching dynamic logic structure design is provided with an improved setup time as well as a smaller design with fewer devices.

Figure 1:
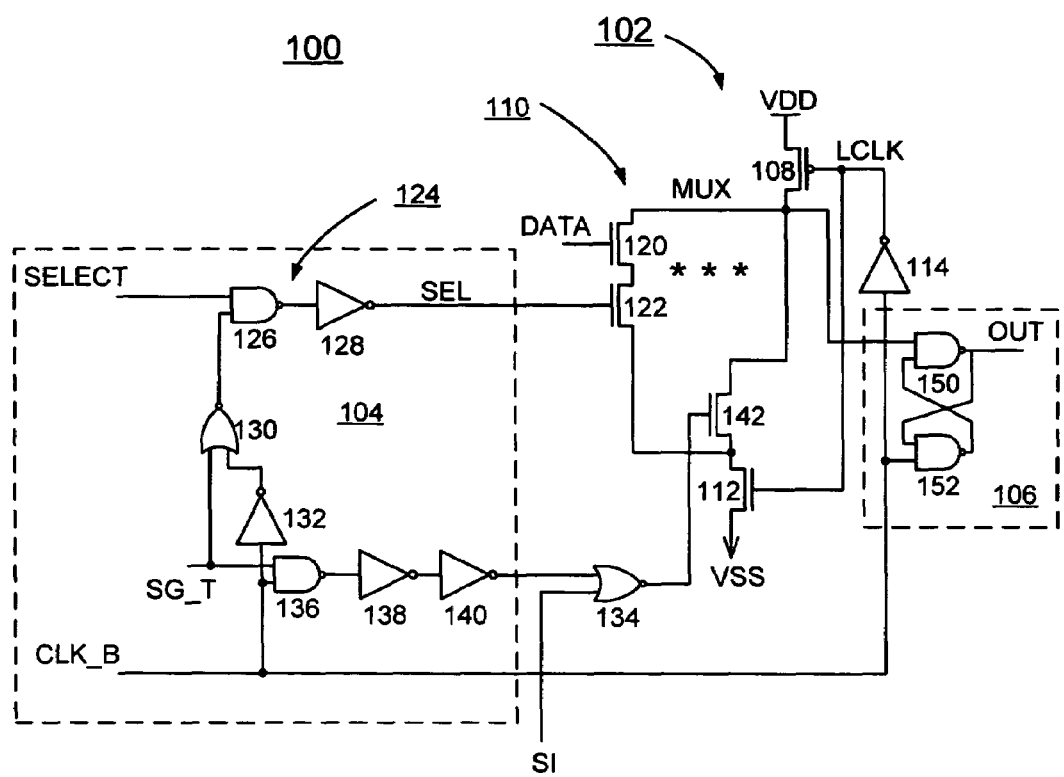
FIG. 1 is a schematic diagram illustrating a latching dynamic logic structure including a dynamic logic gate, a static logic input interface, and a set-reset output latch in accordance with the preferred embodiment.

Referring now to the drawings, in FIG. 1 there is shown a latching dynamic logic structure generally designated by the reference character 100 in accordance with the preferred embodiment. Latching dynamic logic structure 100 includes a dynamic logic gate generally designated by the reference character 102 and a static logic input interface generally designated by the reference character 104 in accordance with the preferred embodiment. Latching dynamic logic structure 100 includes a static set-reset output latch generally designated by the reference character 106 in accordance with the preferred embodiment.

The dynamic logic gate 102 receives a data signal DATA, an output select signal SEL produced by the static logic input interface 104 and a clock signal LCLK. The dynamic logic gate 102 is a complementary metal oxide semiconductor (CMOS) circuit providing a logic function, such as a NOR function, an AND OR Invert function commonly called an AOI, or a NAND function.

The dynamic logic gate 102 includes a precharge p-channel field effect transistor (PFET) 108, a dynamic node MUX, a pulldown network generally designated by the reference character 110, and an evaluation n-channel field effect transistor (NFET) 112. The precharge PFET 108 is connected between a supply voltage VDD and the dynamic node MUX and a gate of PFET 108 receives the clock signal LCLK. An inverter 114 receives an input clock CLK_B and produces the clock signal LCLK. The precharge PFET 108 precharges the node MUX when the clock signal LCLK is low and the clock signal CLK_B is high. The precharge PFET 108 is turned off when the clock signal LCLK is high and the clock signal CLK_B is low. The evaluation NFET 112 is turned off when the clock signal LCLK is low and is turned on when the clock signal LCLK is high and the clock signal CLK_B is low.

The pulldown network 110 is connected between the dynamic node and the evaluation NFET 112. The pulldown network 110 includes a stack of NFETs 120, 122 and the evaluation NFET 112 connected in series between the dynamic node MUX and ground potential VSS. A gate of NFET 120 receives the data signal DATA. A gate of NFET 122 receives the output select signal SEL produced by the static logic input interface 104. Multiple additional pairs of series connected data and select NFETs (not shown) are connected in parallel with NFETs 120,122 to implement a NOR function, for example, for multiple additional data signals 1-N.

By providing the NFET 122 in the pulldown network 110, the dynamic logic gate 102 implements the multiplexing function. The multiplexing function of the pulldown network 110 eliminates the need for a NOR gate that combined a static data signal and a select signal in the static logic input interface of the prior art latching dynamic logic structure.

In accordance with features of the preferred embodiment, latching dynamic logic structure 100 of the preferred embodiment enables an improved setup time that is realized on both the data and the select inputs. The data input DATA now sets up directly to the LCLK, whereas in the prior art a two gate delay occurred before the data met the LCLK. In the prior art latching dynamic logic structure of the above-identified U.S. Pat. No. 6,744,282, the two gate delay resulted from the data signal being inverted and the inverted data signal applied to a NOR gate. The improved setup time is realized on the output select signal SEL produced by the static logic input interface 104 by bringing select into the clock further down the buffering chain as implemented by the latching dynamic logic structure 100 of the preferred embodiment. In the prior art, the select input had four logic gates including a NAND gate, a pair of inverters, and a NOR gate that were traversed before meeting the clock LCLK. With the latching dynamic logic structure 100 of the preferred embodiment only two logic gates are traversed by the select input before meeting the clock LCLK.

The static logic input interface 104 includes a select buffering chain generally designated by the reference character 124 including a two-input NAND gate 126 and an inverter 128. The select input SELECT is applied to a first input of the NAND gate 126. A NOR gate 130 receives a scan gate signal SG_T and an inverted CLK_B clock output of an inverter 132. The output of NOR gate 130 is applied to a second input of the NAND gate 126. The output select signal SEL is produced at the output of inverter 128. Only the two logic gates NAND gate 126 and the inverter 128 are traversed by the select input SELECT to provide the output select signal SEL, meeting the clock LCLK. For each additional pair of series connected data and select NFETs (not shown) that is connected in parallel with NFETs 120, 122 to implement a NOR function, an additional select buffering chain 124 including the two-input NAND gate 126 and inverter 128 also is provided.

Scan port into the latching dynamic logic structure 100 is the same as in the prior art. A two-input NOR gate 134 receives a first input of a scan input SI data signal. The scan gate signal SG_T and a CLK_B clock is applied to a two-input NAND gate 136. The output of NAND gate 136 is coupled by a pair of inverters 138, 140 to a second input of the NOR gate 134. The pair of inverters 138, 140 are provided to increase a signal line driving capability of the NAND gate 136. The output of NOR gate 134 is applied to a gate of a scan port NFET 142 connected between the dynamic node and the evaluation NFET 112. The scan input SI data signal conveys valid scan test input data when the SG_T signal is a logic 1. The output of NOR gate 134 is dependent upon the scan input SI data signal when the SG_T signal is a logic 1. The output of NOR gate 134 is a logic 0 when the SG_T signal is a logic 0 and the NFET 142 is turned off with the applied logic 0 or low gate signal.

The static set-reset output latch 106 includes a cross-coupled pair of NAND gates 150, 152 forming a set-reset (S-R) latch. The NAND gate 150 receives an output signal produced at the node MUX of the dynamic logic gate 104 at an input terminal, and produces the output signal OUT at an output terminal. The other NAND gate 152 of the cross-coupled NAND gate pair receives the clock signal CLK_B at an input terminal. The set-reset output latch 106 is reset when the clock signal CLK_B transitions from high to low, that is in response to a falling edge transition of the clock signal CLK_B. When the set-reset latch 106 is reset, the output signal OUT is driven low.

Figure 2:
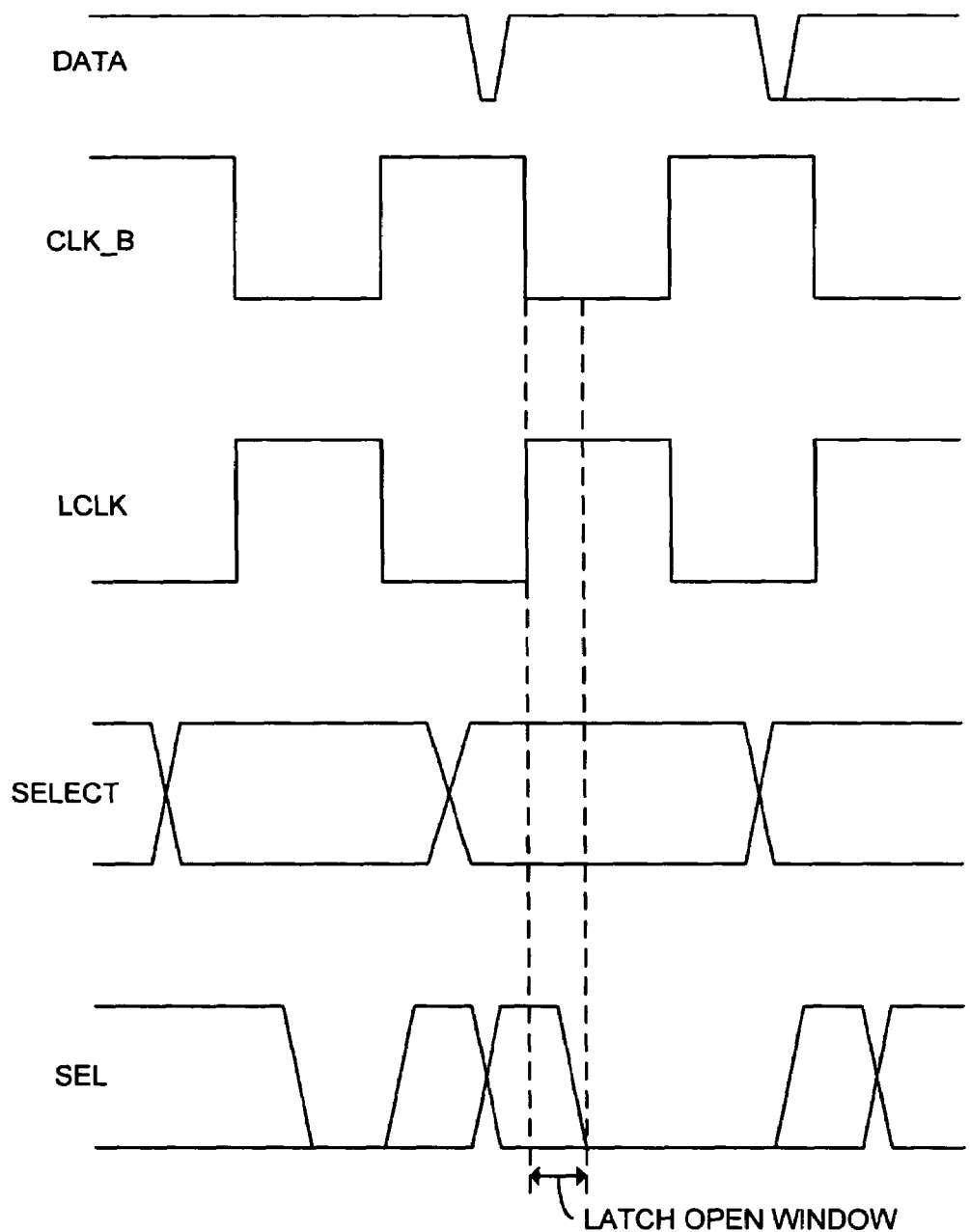
FIG. 2 is a timing diagram illustrating along a vertical axis voltage levels of signals within the latching dynamic logic structure of FIG. 1 with respect to time shown along a horizontal axis when the latching dynamic logic structure is operating in a functional mode in accordance with the preferred embodiment.

Referring also to FIG. 2 there are shown exemplary voltage levels of signals within the latching dynamic logic structure 100 when the latching dynamic logic structure is operating in a functional mode in accordance with the preferred embodiment. The illustrated exemplary voltage levels include the DATA signal applied to the gate of NFET 120, clocks CLK_B and LCKL, the SELECT input to the static logic input interface 104, and the output select signal SEL produced by the static logic input interface 104.

The output select signal SEL via the SELECT input needs to setup to the rising edge of LCLK. The SELECT input needs to hold to the delayed clock CLK_B at the input of NAND 126 or output of NOR 130. The DATA signal applied to the gate of NFET 120 needs to setup to the rising edge of LCLK and needs to hold to the falling output select signal SEL produced by the static logic input interface 104 and applied to the gate of NFET 122. The scan input SI signal applied to the gate of NFET 142 needs to setup to the rising edge of LCLK and needs to hold to the delayed clock CLK_B at the NOR gate 134 or the output of inverter 140. The LATCH OPEN WINDOW time period following the falling edge transition of the clock signal CLK_B needs to be sufficiently long to insure the dynamic node MUX falls.

The set-reset latch 106 is selectively set during a time period following the falling edge transition of the clock signal CLK_B labeled LATCH OPEN WINDOW. The set-reset latch 106 is selectively set dependent upon the logic signal at the node MUX of the dynamic logic gate 102. When the set-reset latch 106 is set, the output signal OUT is driven high.

While the present invention has been described with reference to the details of the embodiments of the invention shown in the drawing, these details are not intended to limit the scope of the invention as claimed in the appended claims.

What is claimed is:

1. A latching dynamic logic structure comprising:
a dynamic logic gate coupled to a static logic input interface and a static set-reset output latch;
said dynamic logic gate receiving a clock signal, a data signal, and a select signal output of the static logic input interface; said dynamic logic gate including a dynamic node and a pulldown network coupled to the dynamic node;
said dynamic logic gate including a precharge transistor for precharging said dynamic node prior to the clock signal transition;
said pulldown network selectively discharging said dynamic node following a clock signal transition dependent on the data signal and the received select signal output of the static logic input interface being active; said pulldown network coupled in series with an evaluation transistor for discharging said dynamic node following the clock signal transition dependent upon the data signal and the received select signal output of the static logic input interface being active; said pulldown network including a pair of series connected transistors connected between said dynamic node and an evaluation transistor; and
said set-reset output latch being coupled to said dynamic node of the dynamic logic gate for providing an output signal.

2. A latching dynamic logic structure as recited in claim 1 wherein one of said pair of series connected transistors receives a gate input of the data signal and another of the pair of series connected transistors receives a gate input of the select signal output of the static logic input interface.

3. A latching dynamic logic structure comprising:
a dynamic logic gate coupled to a static logic input interface and a static set-reset output latch;
said static logic input interface including a select buffering logic chain; said select buffering logic chain including a pair of logic gates including a series connected NAND gate and an inverter; said NAND gate receiving a select input and a second signal;
said dynamic logic gate receiving a clock signal, a data signal, and a select signal output of the static logic input interface; said dynamic logic gate including a dynamic node and a pulldown network coupled to the dynamic node;
said pulldown network selectively discharging said dynamic node following a clock signal transition dependent on the data signal and the received select signal output of the static logic input interface being active;
said set-reset output latch being coupled to said dynamic node of the dynamic logic gate for providing an output signal; and
said second signal is an output of a NOR gate, said NOR gate receiving inputs of an inverted clock signal and a scan gate signal.

4. A latching dynamic logic structure as recited in claim 3 wherein said second signal selectively enables one of a scan testing mode or a functional mode of operation of the latching dynamic logic structure.

5. A latching dynamic logic structure as recited in claim 3 wherein said set-reset output latch includes a pair of cross-coupled NAND gates.

6. A latching dynamic logic structure as recited in claim 5 wherein one of said pair of cross-coupled NAND gates receives an output signal produced at said dynamic node of said dynamic logic gate at an input terminal, and produces the output signal at an output terminal.

7. A latching dynamic logic structure as recited in claim 6 wherein another of said pair of cross-coupled NAND gates receives the clock signal at an input terminal; and wherein said set-reset output latch is reset when a predefined edge transition of said clock signal.

8. A latching dynamic logic structure comprising:
a dynamic logic gate coupled to a static logic input interface and a static set-reset output latch;
said dynamic logic gate receiving a clock signal, a data signal, and a select signal output of the static logic input interface; said dynamic logic gate including a dynamic node, a precharge transistor for precharging said dynamic node prior to the clock signal transition, and a pulldown network coupled to the dynamic node;

said pulldown network including a pair of transistors connected in series between said dynamic node and an evaluation transistor for selectively discharging the dynamic node following the clock signal transition dependent upon the data signal and the received select signal output of the static logic input interface being active; and said set-reset output latch being coupled to said dynamic node of the dynamic logic gate for providing an output signal.

9. A latching dynamic logic structure as recited in claim 8 wherein one of said pair of series connected transistors receives a gate input of the data signal and another of the pair of series connected transistors receives a gate input of the select signal output of the static logic input interface.

10. A latching dynamic logic structure as recited in claim 8 wherein said static logic input interface includes a select buffering logic chain; said select buffering logic chain including a pair of logic gates.

11. A latching dynamic logic structure as recited in claim 8 wherein said pair of logic gates include a series connected NAND gate and an inverter; said NAND gate receives a select input and a second signal.

12. A latching dynamic logic structure as recited in claim 11 wherein said second signal is provided to selectively enable one of a scan testing mode or a functional mode of operation of the latching dynamic logic structure.

13. A latching dynamic logic structure as recited in claim 8 wherein said static set-reset output latch includes a pair of cross-coupled NAND gates.

* * * * *